(12) United States Patent  
Kwon

(10) Patent No.: US 7,276,430 B2  
(45) Date of Patent: Oct. 2, 2007

(54) MANUFACTURING METHOD OF SILICON ON INSULATOR WAFER

(75) Inventor: Sung Ku Kwon, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 251 days.

(21) Appl. No.: 11/232,722

(22) Filed: Sep. 21, 2005

(65) Prior Publication Data

US 2006/0128075 A1 Jun. 15, 2006

(30) Foreign Application Priority Data

Dec. 14, 2004 (KR) ............... 10-2004-0105744
May 6, 2005 (KR) ............... 10-2005-0037970

(51) Int. Cl.
*H01L 21/30* (2006.01)

(52) U.S. Cl. ............... 438/459; 257/E21.122

(58) Field of Classification Search ........ 438/455–459; 257/E21.122

See application file for complete search history.

(56) References Cited

U.S. PATENT DOCUMENTS 6,306,730 B2   10/2001  Mitani et al.
6,770,507 B2   8/2004   Abe et al.
6,884,696 B2 * 4/2005   Aga et al. ............ 438/459
7,084,046 B2 * 8/2006   Mitani et al. ............ 438/459
2006/0121696 A1 * 6/2006 Shiota et al. ............ 438/459

OTHER PUBLICATIONS

Materials Science and Engineering B72 (2000) 150-155.
Applied Physics Letters, vol. 80, No. 5, Feb. 4, 2002, 880-882.

* cited by examiner

*Primary Examiner*—Richard A. Booth
(74) *Attorney, Agent, or Firm*—Blakely Sokoloff Taylor & Zafman

(57) ABSTRACT

Provided is a method of manufacturing a silicon on insulator (SOI) substrate, which includes the steps of (a) forming a buried oxidation layer to a predetermined depth of a first wafer and forming an oxidation layer on a surface of the first wafer; (b) bonding a second wafer onto the first wafer; (c) selectively removing the oxidation layer so as to expose a bottom surface of the first wafer; (d) selectively removing the exposed bottom silicon layer of the first wafer using the buried oxidation layer as an etch stop layer; and (e) removing the buried oxidation layer to expose a top surface of the first wafer, and thinning the exposed top surface of the first wafer to a predetermined thickness, so that a process can be relatively simple and can be readily carried out, thereby manufacturing an SOI substrate having a uniform silicon thickness of high quality and an ultra thin characteristic.

10 Claims, 3 Drawing Sheets

MANUFACTURING METHOD OF SILICON ON INSULATOR WAFER

CROSS-REFERENCE TO RELATED APPLICATION

This application claims priority to and the benefit of Korean Patent Application No. 2004-105744, filed Dec. 14, 2004, and No. 2005-37970, filed May 6, 2005, the disclosure of which is incorporated herein by reference in its entirety.

BACKGROUND

1. Field of the Invention

The present invention relates to a method of manufacturing a silicon on insulator (hereinafter, referred to as SOI) which is essential for implementing a semiconductor integrated circuit having ultra large scale integration, very high speed, and low power consumption characteristics, and in particular, to a method of manufacturing an ultra thin body SOI substrate having a uniform thickness and a good interface characteristic of high quality which are essential in manufacture of an nano-class semiconductor device.

2. Discussion of Related Art

In general, an SOI substrate has been developed as a substrate of a next-generation electronic device which is capable of overcoming problems such as unstable insulation between devices and occurrence of parasitic capacitance of the conventional silicon substrate when a large mount of electronic devices are integrated.

A structure of the SOI substrate means a structure that an insulating layer is formed on a silicon wafer and a single crystalline silicon layer is present thereon, and, in a broad sense, means a structure that a silicon single crystal is formed on the top of the insulator regardless of kinds of a lower substrate and an insulating layer.

A technique of manufacturing such an SOI substrate has been progressed with a research of silicon on sapphire (SOS), and a zone-melting and recrystallization (ZMR) method, a porous silicon oxidation method, a lateral epitaxial growth method of silicon, and so forth have been researched in its initial development, however, a separation by implantation of oxygen (SIMOX) technique, a unibond technique using a smart cut, an epitaxial layer transfer (ELTRAN) technique or the like have been a main stream in recent years.

According to the conventional SIMOX technique, oxygen of about $1 \times 10^{17}$ to $9 \times 10^{17}$ atoms/cm$^2$ is injected into the silicon, which is then subjected to annealing and oxidation at a high temperature of about 1300° C. to 1500° C. for recrystallization of the silicon and stability of the buried oxidation layer and defect removal.

However, according to the conventional SIMOX technique, it is difficult to form a silicon layer having a uniform thickness and a low concentration of impurity, and high defect density at an interface and a region near the interface, and a poor surface roughness can adversely affect a device.

In addition, according to the conventional UNIBOND technique, a smart cut method is employed by which hydrogen ions are first injected into a silicon wafer in which an insulating layer is already formed, which is then bonded with another silicon wafer to have a lower part of the hydrogen ion injection location of the silicon wafer fall off through a subsequent annealing process to thereby form a thin silicon layer, so that effects such as higher crystal quality, higher BOX quality, less surface roughness and low price process in thick film SOI can be expected compared to other methods of the related art, however, a thickness uniformity is still required, and productivity is degraded due to several processes such as a chemical mechanical polishing (CMP) process.

In addition, the conventional ELTRAN technique is one that first forms a porous silicon layer on a silicon wafer and forms a single crystalline silicon layer thereon by an epitaxial growth method, which is then bonded with the silicon wafer where an insulating layer is formed, and subsequently, the silicon bulk and the porous layer are removed by polishing and etching processes to thereby obtain a planarized silicon layer on the insulator, which is relatively advantageous in control of a thickness of the silicon layer, however, it is not good for matching with a conventional complementary metal oxide semiconductor (CMOS) process, and is limited to some applications due to the degradation of film quality, particle occurrence, poor surface roughness, degraded reliability or the like.

As described above, the techniques (SIMOX, UNIBOND, and ELTRAN or the like) for manufacturing an ultra thin body (UTB) SOI substrate used in the manufacture of the UTB SOI CMOS device, do not completely meet requirements of the UTB SOI wafer which requires control on a uniform thickness, low defect density, and an upper silicon thickness of several nanometers in a nano-class device.

SUMMARY OF THE INVENTION

The present invention is directed to a method of manufacturing an UTB SOI substrate having a uniform thickness characteristic and a good interface characteristic of high quality which are essential for manufacturing a nano-class semiconductor device.

One aspect of the present invention is to provide a method of manufacturing an SOI substrate, which includes the step of: (a) forming a buried oxidation layer to a predetermined depth of a first wafer by implantation and annealing, and forming an oxidation layer on a surface of the first wafer by high temperature oxidation to reduce interface defect density and improve interface smoothness; (b) bonding a second wafer onto the first wafer; (c) selectively removing the oxidation layer so as to expose a bottom surface of the first wafer; (d) selectively removing the exposed bottom surface of the first wafer using the buried oxidation layer as an etch stop layer; and (e) removing the buried oxidation layer to expose a top surface of the first wafer, and removing the exposed top surface of the first wafer to a predetermined thickness.

In this case, the step of forming the buried oxidation layer preferably includes the steps of: (a-1) injecting oxygen ions to into a surface of the first wafer to form the buried oxidation layer to a predetermined depth of the first wafer; and (a-2) carrying out annealing and oxidation processes to form the oxidation layer on the first wafer so as to make uniform an interface of the buried oxidation layer and remove defects of its rough surface.

Preferably, the step of bonding the second wafer onto the first wafer includes the step of forming an oxidation layer with a predetermined thickness on a surface of the second wafer.

Preferably, after the step of removing the buried oxidation layer, the step of removing the exposed top surface of the first wafer to a predetermined thickness uses at least one method among an oxidation/etching method, a CMP method, and a hydrogen annealing method in order to reduce its surface defects and make its thickness thin.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

FIGS. 1A to 1H are cross-sectional views for explaining a method of manufacturing an SOI substrate in accordance with an embodiment of the present invention.

Figure 1A:
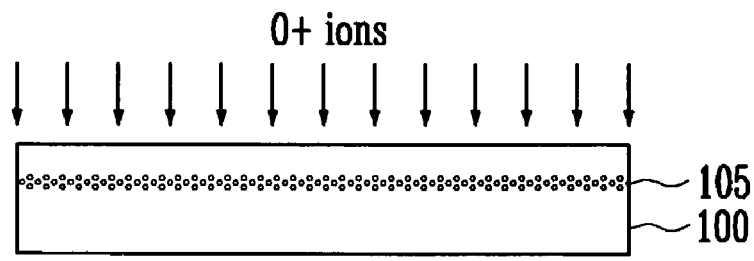
FIGS. 1A to 1H are cross-sectional views for explaining a method of manufacturing an SOI substrate in accordance with an embodiment of the present invention.

Referring to FIG. 1A, a predetermined amount of oxygen ions 105 are injected into a surface of a first silicon wafer 100 used as a control wafer.

In this case, the oxygen ions 105 of about 1 to $5 \times 10^{17 \sim 18}$ atoms/cm$^2$ are preferably injected in an energy range of about 30 to 200 KeV.

Figure 1B:
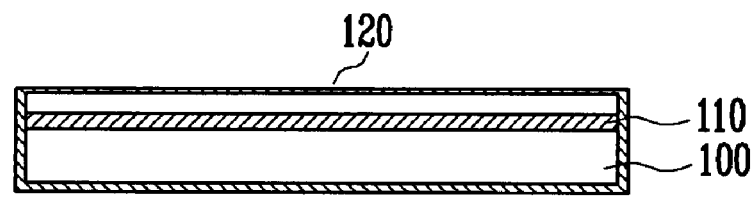

Referring to FIG. 1B, silicon is recrystallized and defects are removed while annealing and oxidation processes are carried out so as to form a buried oxidation layer 110 to a predetermined depth. In this case, the buried oxidation layer 110 is formed to a predetermined depth of the first silicon wafer 100 by the injected oxygen ions 105, and a first oxidation layer 120 is formed by the surface oxidation of the first silicon layer on a surface of the buried oxidation layer 110 in a thickness range of about 20 to 200 nm.

Accordingly, an interface of the buried oxidation layer 110 becomes uniform and defects of its rough surface are removed. That is, when an annealing process is additionally carried out in the oxidation atmosphere, the surface defects are concentrated to the surface of the buried oxidation layer 110 so that the interface state and the film quality can be significantly improved. Such an oxidation process may be skipped, and may be positively utilized as a method capable of reducing defects, improving the interface roughness, and making thin a thickness of the first silicon wafer 100 if necessary.

In addition, a thickness of the first silicon wafer 100 primarily becomes thinner by means of the formation of the first oxidation layer 120.

In the meantime, the annealing process is preferably carried out in a temperature range of about 1300° C. to 1500° C.

Figure 1C:
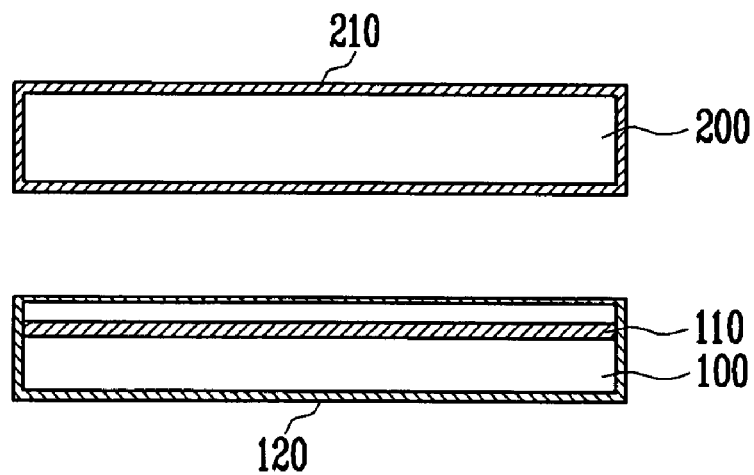

Referring to FIG. 1C, a second silicon wafer 200 used as a handle wafer is prepared. In this case, a second oxidation layer 210 having a thickness of about 5 to 1000 nm is preferably formed on a surface of the second silicon wafer 200 in the box shape.

Figure 1D:
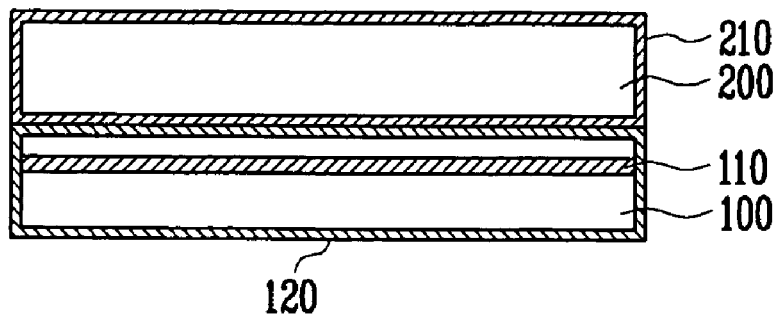

Referring to FIG. 1D, the first oxidation layer 120 of the first silicon wafer 100 and the second oxidation layer 210 of the second silicon wafer 200 are bonded to each other by a typical wafer bonding method (e.g. a hydrogen bonding method).

Figure 1E:
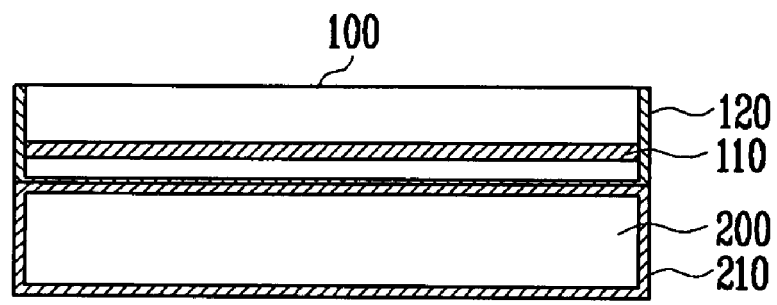

Referring to FIG. 1E, the first silicon oxide layer 120 formed below the first silicon wafer 100 is selectively removed so as to expose a bottom surface of the first silicon wafer 100.

Figure 1F:
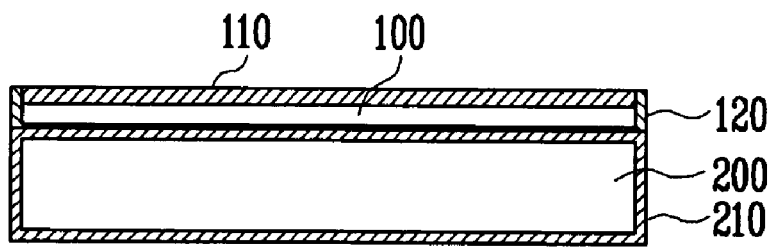

Referring to FIG. 1F, the exposed bottom surface of the first silicon wafer 100 is selectively removed using the buried oxidation layer 110 as an etch stop layer so as to expose the buried oxidation layer 110. In this case, the exposed first silicon wafer 100 is preferably removed using, for example, a CMP method, a wet or dry etching method.

Figure 1G:
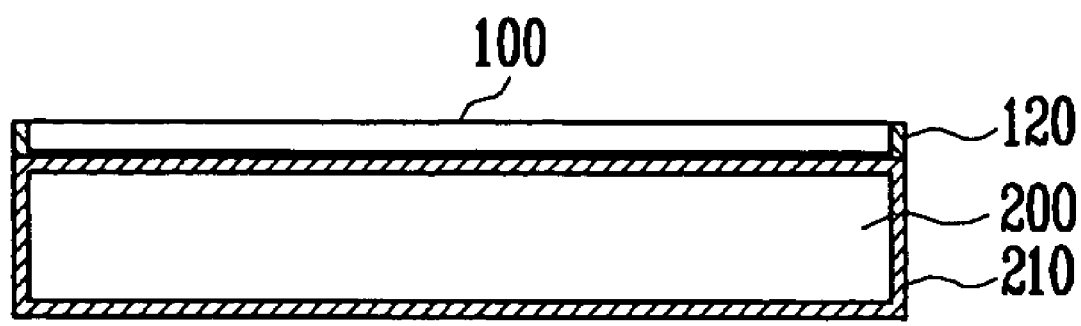
Figure 1H:
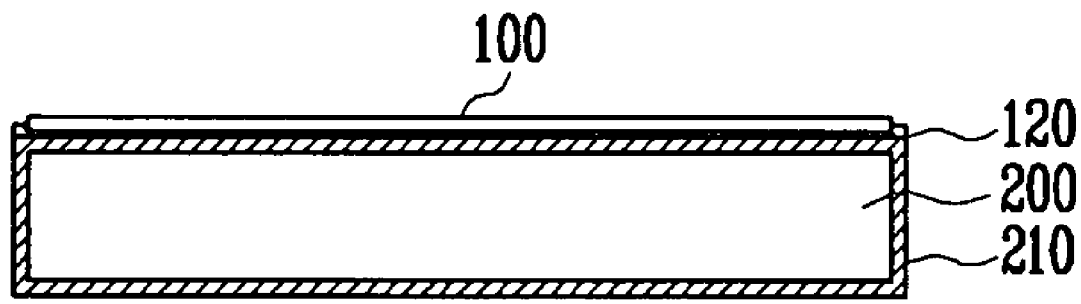

Referring to FIGS. 1G and 1H, the buried oxidation layer 110 is removed, for example, by a wet etching method so as to expose a top surface of the first silicon wafer 100, and the exposed top surface of the first silicon wafer 100 is then thinned to a predetermined thickness.

In this case, the exposed top surface of the first silicon wafer 100 is preferably thinned by at least one method among an oxidation/etching, a CMP, and a hydrogen annealing in order to reduce its surface defects and make its thickness thin.

In the meantime, metal impurities may be injected during the process of FIGS. 1A and 1B, so that the first oxidation layer 120 may be removed and a silicon epitaxial layer of high quality in which low concentration impurities are injected at a low temperature may be subsequently deposited after the process of FIG. 1B is carried out in order to reduce effects of the injected metal impurities, thereby manufacturing a silicon thin film having high quality and high purity.

In addition, after the process of FIG. 1B is carried out, the first oxidation layer 120 on the first silicon wafer 100 may be removed and a SiGe buffer layer, a SiGe relaxation layer, and a strained silicon layer may be deposited to manufacture a UTB SOI substrate having a strained silicon layer.

According to the method of manufacturing the SOI substrate of the present invention as described above, a UTB SOI substrate can be advantageously provided which has a uniform thickness characteristic and a good interface characteristic of high quality which are essential for manufacturing a nano-class semiconductor device.

In addition, according to the present invention, an existing technique can be utilized, and it may not require a CMP process accompanying a high cost, so that the process can be relatively simple and can be readily carried out.

In addition, according to the present invention, it can contribute to manufacture of a nano-class semiconductor device, a research on the next generation new device, manufacture of an ultra high performance circuit, and system design, and can contribute to advancement of practical use of products applied with the same.

Although the present invention has been described with reference to certain exemplary embodiments of the method of manufacturing the SOI substrate, it will be understood by those skilled in the art that a variety of modifications and variations may be made to the present invention without departing from the spirit or scope of the present invention defined in the appended claims, and their equivalents.

What is claimed is:

1. A method of manufacturing a silicon on insulator (SOI) substrate, the method comprising the steps of:
    (a) forming a buried oxidation layer to a predetermined depth of a first wafer and forming an oxidation layer on a surface of the first wafer;
    (b) bonding a second wafer onto the first wafer;

(c) selectively removing the oxidation layer so as to expose a bottom surface of the first wafer;

(d) selectively removing the exposed bottom surface of the first wafer using the buried oxidation layer as an etch stop layer; and (e) removing the buried oxidation layer to expose a top surface of the first wafer, and thinning the exposed top surface of the first wafer to a predetermined thickness.

2. The method according to claim 1, wherein the step of forming the buried oxidation layer includes the steps of:

(a-1) injecting oxygen ions to into a surface of the first wafer to form the buried oxidation layer to a predetermined depth of the first wafer; and (a-2) carrying out annealing and oxidation processes to form the oxidation layer on the surface of the first wafer so as to make uniform an interface of the buried oxidation layer and remove defects of its rough surface.

3. The method according to claim 2, wherein the oxygen ions of about 1 to $5\times10^{17\sim18}$ atoms/cm$^2$ are injected in an energy range of about 30 to 200 KeV.

4. The method according to claim 2, wherein the annealing process is carried out in a temperature range of about 1300° C. to 1500° C.

5. The method according to claim 1, wherein the step of bonding the second wafer onto the first wafer further includes the step of forming an oxidation layer with a predetermined thickness on a surface of the second wafer.

6. The method according to claim 1, wherein the step of bonding the second wafer onto the first wafer includes the step of removing an oxidation layer formed on a bonding surface of the first wafer before bonding the second wafer onto the first wafer.

7. The method according to claim 1, after the step of bonding the second wafer onto the first wafer includes the step of reoxidizing a bonding surface of the first wafer before bonding the second wafer onto the first wafer.

8. The method according to claim 1, wherein the step of removing the buried oxidation layer, the step of thinning the exposed top surface of the first wafer to a predetermined thickness uses at least one method among an oxidation/etching method, a CMP method, and a hydrogen annealing method in order to reduce its surface defects and make its thickness thin.

9. The method according to claim 1, further comprising:
removing the oxidation layer after forming the buried oxidation layer, and depositing a doped silicon epitaxial layer.

10. The method according to claim 1, further comprising:
removing the oxidation layer after forming the buried oxidation layer, and depositing a SiGe buffer layer, a SiGe relaxation layer, and a strained silicon layer.

* * * * *